US007835537B2

(12) United States Patent
Cheney

(10) Patent No.: US 7,835,537 B2
(45) Date of Patent: Nov. 16, 2010

(54) LOUDSPEAKER INCLUDING SLOTTED WAVEGUIDE FOR ENHANCED DIRECTIVITY AND ASSOCIATED METHODS

(76) Inventor: Brian E. Cheney, 3429 Morningside Dr., El Sobrante, CA (US) 94803

( * ) Notice: Subject to any disclaimer, the term of this patent is extended or adjusted under 35 U.S.C. 154(b) by 1434 days.

(21) Appl. No.: 11/249,572

(22) Filed: Oct. 13, 2005

(65) Prior Publication Data

US 2007/0086615 A1 Apr. 19, 2007

(51) Int. Cl.

| | |
|---|---|
| ***H04R 9/08*** | (2006.01) |
| *H04R 1/20* | (2006.01) |
| *H04R 1/00* | (2006.01) |
| *H05R 1/00* | (2006.01) |
| *H05K 5/00* | (2006.01) |

(52) U.S. Cl. ....................... 381/337; 381/345; 381/423; 381/432; 381/431; 381/338; 181/148

(58) Field of Classification Search ................. 381/386, 381/431

See application file for complete search history.

(56) References Cited

U.S. PATENT DOCUMENTS

| | | | | |
|---|---|---|---|---|
| 3,424,873 | A | 1/1969 | Walsh | 179/115.5 |
| 4,134,471 | A | 1/1979 | Queen | 181/147 |
| 4,472,834 | A | 9/1984 | Yamamuro et al. | 381/61 |
| 4,856,071 | A * | 8/1989 | Marquiss | 381/431 |
| 4,870,691 | A | 9/1989 | Mindel | 381/159 |
| 4,975,965 | A | 12/1990 | Adamson | 381/156 |
| 5,901,235 | A | 5/1999 | Thigpen et al. | 381/431 |
| 6,059,069 | A | 5/2000 | Hughes, II | 181/152 |
| 6,324,052 | B1 | 11/2001 | Azima et al. | 361/683 |
| 6,411,718 | B1 | 6/2002 | Danley et al. | 381/342 |
| 6,513,622 | B1 | 2/2003 | Gelow et al. | 181/152 |
| 6,621,909 | B1 | 9/2003 | Webb et al. | 381/342 |
| 6,760,462 | B1 | 7/2004 | Thigpen | 381/431 |
| 6,950,530 | B2 | 9/2005 | Baird et al. | 381/343 |

(Continued)

FOREIGN PATENT DOCUMENTS

WO 2005/074318 A1 8/2005

OTHER PUBLICATIONS

"What is Mad?", Magnetic Audio Devices, pp. 1-2, available at www.getmad.com/whatismad.html.

(Continued)

*Primary Examiner*—Brian Ensey
*Assistant Examiner*—Sunita Joshi
(74) *Attorney, Agent, or Firm*—Allen, Dyer, Doppelt, Milbrath & Gilchrist, P.A.

(57) ABSTRACT

A loudspeaker may include a baffle, a planar diaphragm transducer carried by the baffle and having a front surface for radiating acoustic energy therefrom, and a slotted waveguide adjacent the front surface of the planar diaphragm transducer. The planar diaphragm transducer may be operable to a desired high frequency, and the slotted opening may have a width not substantially greater than a wavelength corresponding to the desired high frequency. For example, for a desired high frequency of about 20 KHz, the slotted opening may have a width not greater than about two-thirds of an inch. Accordingly, the loudspeaker including the slotted waveguide may provide nearly constant horizontal directivity over a large angle. In another embodiment, the loudspeaker may include a conical diaphragm transducer with a slotted waveguide adjacent its front surface.

30 Claims, 4 Drawing Sheets

U.S. PATENT DOCUMENTS 7,218,749 B1 * 5/2007 Noponen et al. ............ 381/431

OTHER PUBLICATIONS

"Bohlender Graebener NEO8 Planar Transducer", Parts Express, pp. 1-2, 1996-2005 Parts Express, available at www.partsexpress.com/pe/pshowdetl.cfm?&DID=7&Partnumber=264-712&ctab=15.

"The VMPS RM 40 Loudspeaker", VMPS Audio Products, pp. 1-2, 2002, available at www.vmpsaudio.com/wulf2.htm.

"SLS Loudspeakers PRD Planar Ribbon Drivers—a Breakthrough Technology for Contemporary Loudspeaker Industry", SLS Loudspeakers, 2001, pp. 1-14, available at www.slsloudspeakers.com/media/docs/RibbondriverWhitepaper.pdf.

"Pro-Line Radia Professional Speakers from Bohlender-Graebener . . . An Intelligent Solution for Sound in the New Millennium", Radia Professional Speakers, 2000, pp. 1-17, available at www.fuziontech.co.uk/ftproot/Fuzion/Datasheets....

* cited by examiner

LOUDSPEAKER INCLUDING SLOTTED WAVEGUIDE FOR ENHANCED DIRECTIVITY AND ASSOCIATED METHODS

FIELD OF THE INVENTION

The present invention relates to the field of loudspeakers, and, more particularly, to loudspeakers and associated methods, such as for the reproduction of high quality music.

BACKGROUND OF THE INVENTION

A typical home entertainment audio system includes two or more loudspeakers that serve as transducers to convert electrical signals into acoustic energy to be heard and enjoyed by the listener. A significant advance in speakers has been the use of planar diaphragm or ribbon transducers. A planar diaphragm transducer includes a pair of spaced apart permanent magnet arrays with a movable diaphragm or ribbon therebetween. Electrical conductors are supported on the movable diaphragm and receive the driving signal. Accordingly, the diaphragm moves inwardly and outwardly in a push-pull arrangement with respect to the magnet arrays to convert the electrical energy into acoustic energy or sound. Such planar transducers are disclosed in U.S. Pat. Nos. 5,901,235 and 6,760,462, for example.

Continuing improvements in such planar diaphragm transducers have been forthcoming particularly with the use of improved permanent magnet materials, such as neodymium. A planar transducer is excellent sonically, has a fast response due to a low moving mass, has low distortion, has good sensitivity, has high power handling capability, and remains a fairly constant resistive load thereby not needing a matching transformer. Such planar diaphragm transducers are used by several loudspeaker manufacturers including VMPS Audio Products of El Sobrante, Calif., the assignee of the present invention. Typically, one or more cone-shaped drivers or conical diaphragm transducers may be included within a common housing or baffle with the one or more planar diaphragm transducers.

Another feature relating to loudspeaker performance is directivity. In particular, horizontal directivity is a measure of amplitude linearity for different frequencies over a horizontal angle in front of the loudspeaker. A stereo system, for example, desirably produces a virtual image for the listener by taking advantage of the localization ability of human hearing. Accordingly, relatively constant horizontal directivity is desired over a fairly wide angle from the axis of the loudspeaker. This may also accommodate multiple listeners.

Several attempts have been made in the past to address and improve directivity. For example, U.S. Pat. No. 4,134,471 to Queen discloses a loudspeaker including a radial horn that radiates a spherical sector over 360 degrees through a horizontal plane. One or two speakers are mounted so that they produce a pulsating cylindrical wave to feed into the radiator and an inverted conical member is mounted in the transition portion between the pulsating cylinder and the output horn. This output is blended with similar wavefronts produced by a low frequency loudspeaker that is acoustically associated with a vented housing.

U.S. Pat. No. 6,513,622 to Gelow et al. is directed to a cinema loudspeaker system and includes, for example, a midrange frequency module that is an integrated multi-band waveguide assembly configured to provide a vertical array of four contiguous specially-shaped waveguide regions each driven by a cone type transducer driver. The required defined coverage is accomplished through a combination of special shaping of the waveguide directing surfaces with vertical asymmetry to provide controlled directivity vertically and horizontally, and frequency-selective filtering in a passive network that accomplishes the required overall coverage by splitting the drive power into two paths with different special transfer functions allocated to the lower two transducers as a low-frequency portion and the to the upper two transducers as a high-frequency portion of the midrange assembly. The four drivers are separated by partitions shaped with strategic spacing dimensions, each driver working into an individual waveguide throat portion, and each directed at an inclined angle downwardly from horizontal, to optimize defined coverage uniformity. The throat portions combine smoothly into a common flared mouth portion that extends to the substantially rectangular shape of the front outline of the midrange module.

Despite continuing advances in loudspeakers, and particularly in the use and improvement of planar or ribbon diaphragm transducers, such may not have relatively constant directivity over larger angles.

SUMMARY OF THE INVENTION

In view of the foregoing background, it is therefore an object of the present invention to provide a loudspeaker and associated method to produce improved directivity.

This and other objects, features, and advantages in accordance with the present invention are provided by a loudspeaker comprising a baffle, at least one planar diaphragm transducer carried by the baffle and having a front surface for radiating acoustic energy therefrom, and a slotted waveguide adjacent the front surface of the at least one planar diaphragm transducer. For example, the slotted waveguide may comprise a body having a slotted opening therein, and the planar diaphragm transducer may have an elongated rectangular shape aligned with the slotted opening. In some embodiments, the planar diaphragm transducer may have a width greater than a width of the slotted opening. Moreover, the planar diaphragm transducer may be operable to a desired high frequency, and the slotted opening may have a width not substantially greater than a wavelength corresponding to the desired high frequency. For example, for a desired high frequency of about 20 KHz, the slotted opening may have a width not greater than about two-thirds of an inch. Accordingly, the loudspeaker including the slotted waveguide may provide a constant horizontal directivity defined by less than a ±6 dB variation over at least ±75 degrees from an axis of the at least one planar transducer and over a frequency range of up to about 20 KHz.

The slotted waveguide may comprises a sound absorbing layer adjacent the surface of the planar diaphragm transducer, and a sound reflecting layer adjacent the sound absorbing layer, for example. In addition, the slotted waveguide may have its outer peripheral portions aligned with corresponding outer peripheral portions of the baffle.

The planar diaphragm transducer may comprise a magnetic planar diaphragm transducer, although in other embodiments the planar diaphragm transducer may be an electrostatic planar diaphragm transducer. The slotted waveguide may also permit use of a relatively low order cross-over filter, such as a first or second order cross-over filter. Of course, the loudspeaker may also include one or more conical diaphragm transducers carried by the baffle.

A method aspect of the invention is directed to increasing the directivity of a loudspeaker comprising a baffle, and at least one planar diaphragm transducer carried by the baffle and having a front surface for radiating acoustic energy therefrom. The method may include positioning a slotted waveguide adjacent the front surface of the at least one planar diaphragm transducer.

The slotted waveguide may also be adapted to conical diaphragm transducers as well. Accordingly, another loudspeaker embodiment in accordance with the invention may include a baffle, at least one conical diaphragm transducer carried by the baffle and having a front surface for radiating acoustic energy therefrom, and a slotted waveguide adjacent the front surface of the at least one conical diaphragm transducer. A corresponding method may include positioning the slotted waveguide adjacent the front surface of the at least one conical diaphragm transducer.

DETAILED DESCRIPTION OF THE PREFERRED EMBODIMENTS

Figure 1:
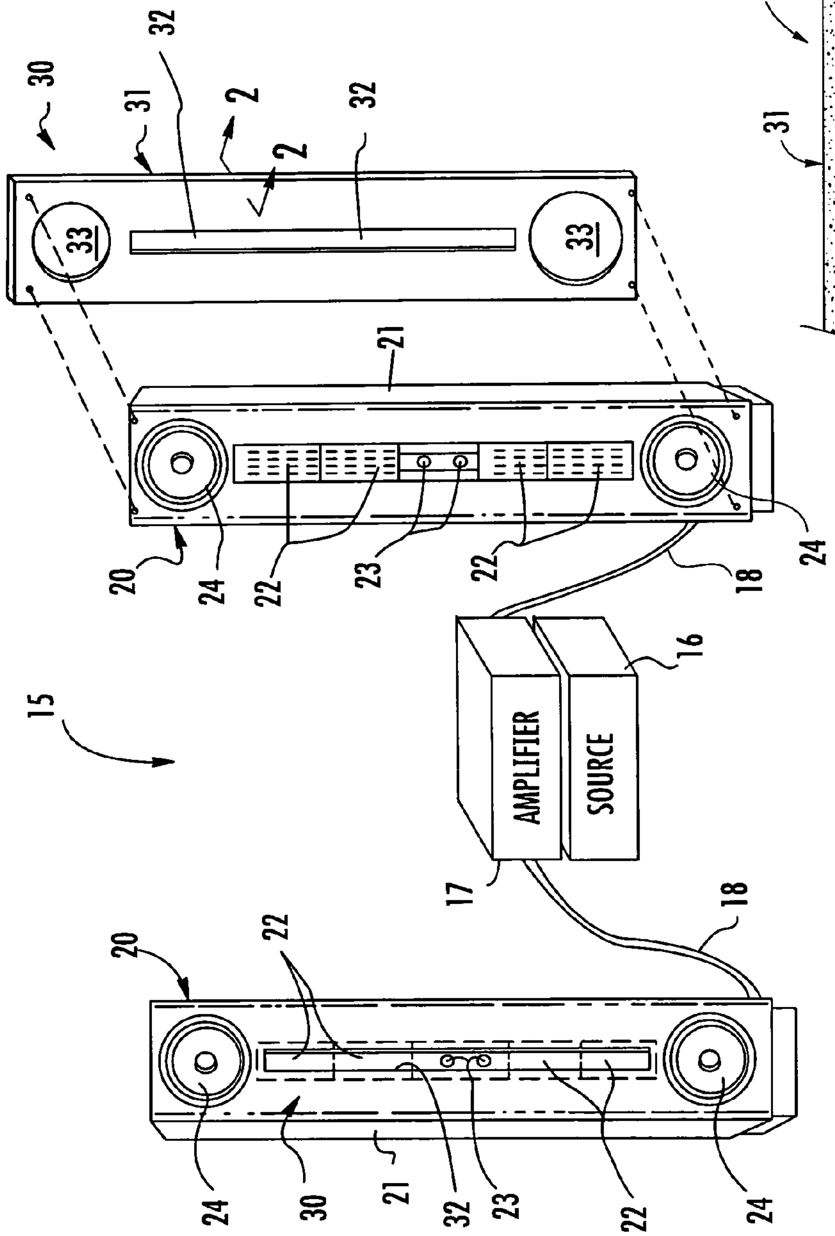
FIG. 1 is a front perspective view of a stereo audio system including a pair of loudspeakers in accordance with the invention.

The invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Referring initially to FIGS. 1-4, a loudspeaker 20 in accordance with the invention is first described. As will be appreciated by those skilled in the art, a typical stereo audio system 15 may include a signal source 16, such as a CD player, and an amplifier 17 connected to the signal source to amplify the signals therefrom. The amplifier 17, in turn, is connected via cables 18 to drive the illustrated pair of spaced apart loudspeakers 20. Of course, the loudspeaker 20 in accordance with the present invention could be used in a monaural system or in a surround sound system including multiple loudspeakers as will be appreciated by those skilled in the art.

The loudspeaker 20 includes an enclosure or baffle 21 in the form of a generally rectangular box, although the baffle need not completely surround the other components, and indeed ports are often provided to improve efficiency and sound quality. The illustrated loudspeaker 20 includes top and bottom sets of mid-frequency range magnetic planar diaphragm transducers 22, a centrally located pair of high-frequency range magnetic planar diaphragm transducers 23, and top and bottom, low-frequency range, conical diaphragm transducers 24. The transducers 22-24 may be arranged in closely spaced relation on the narrow front surface of the baffle 21 which is not appreciably wider than the larger woofers or bass transducers 24 as shown in the illustrated embodiment.

The low-frequency conical diaphragm transducers 24 may typically have a diameter in a range of about 4 inches to 18 inches. The treble or high frequency planar diaphragm transducers 23 may have a width in the range of ⅜ inches to 1 inch, for example. The mid-range planar diaphragm transducers 22 may have a width in a range of about 1 inch to 4 inches, with the mid-range and high-frequency range transducers typically covering a range of frequencies from about 100 Hz to 300 Hz and up to 20 KHz. The transducers 22-24 also extend for nearly the full vertical extent of the baffle 21 in the illustrated loudspeaker 20.

The loudspeaker 20 also includes a slotted waveguide 30 positioned adjacent the front face of the transducers 22-24. The slotted waveguide 30 is shown installed on the left hand loudspeaker 20 of the stereo system of FIG. 1, and schematically removed from the right hand loudspeaker for clarity of explanation. The slotted waveguide 30 illustratively includes a sheet or body 31 having a slotted opening 32 therein extending vertically along a medial portion of the body. The slotted waveguide 30 also includes upper and lower circular openings 33 aligned with the low-frequency range transducers 24. For installation ease and appearance reasons, the slotted waveguide 30 illustratively has its outer peripheral portions aligned with corresponding outer peripheral portions of the baffle 21 although other configurations are also possible as will be appreciated by those skilled in the art. Fabric cover grills, not shown, may also be used to cover the slotted waveguide 30.

Figure 3:
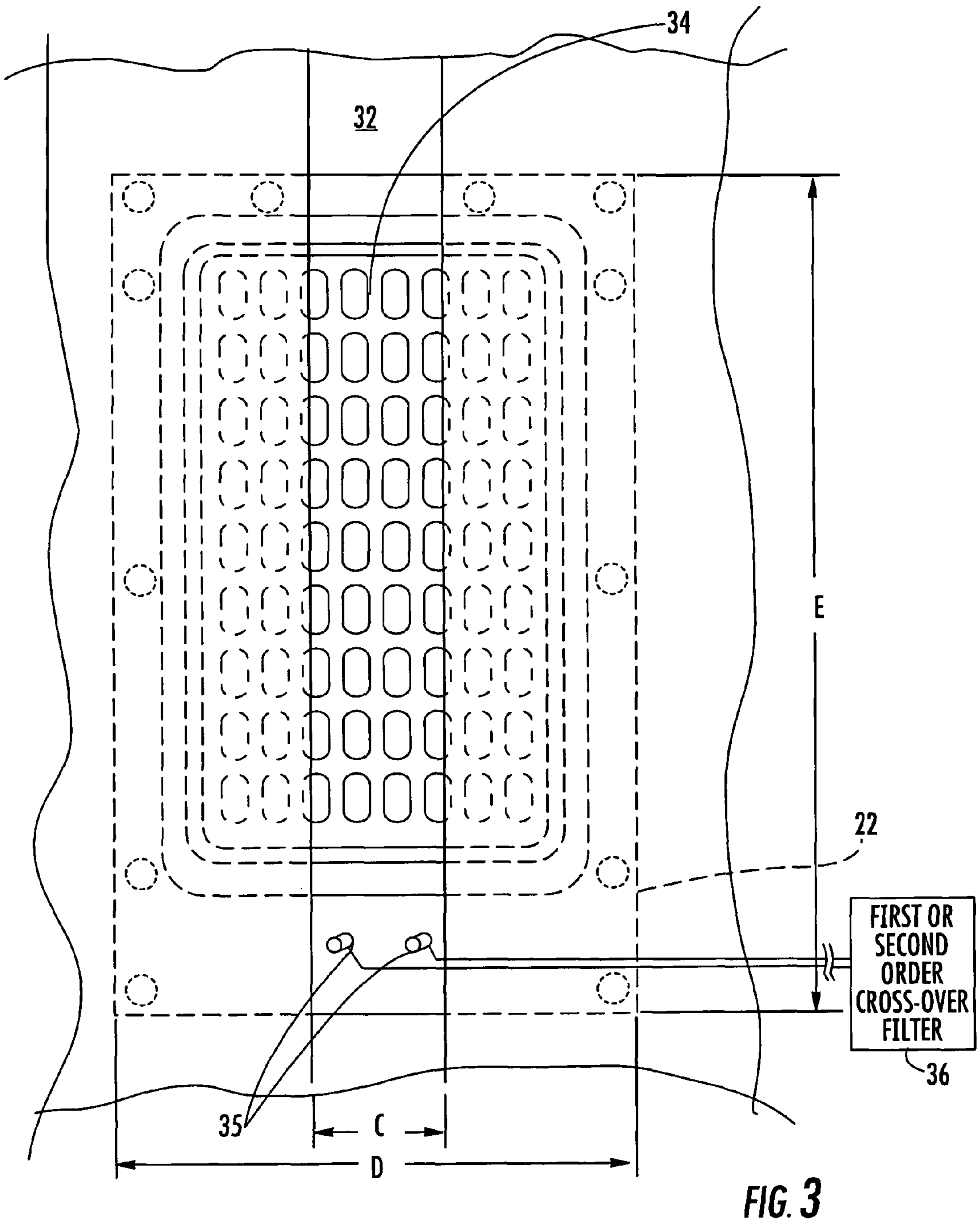
FIG. 3 is an enlarged front elevational view of a portion of a loudspeaker shown in FIG. 1.

With particular reference to FIG. 3, the planar diaphragm transducer 22 has an elongated generally rectangular shape aligned with the slotted opening 32. The illustrated planar diaphragm transducer 22 has a width greater than a width of the slotted opening 32. As will be appreciated by those skilled in the art, a typical magnetic planar diaphragm transducer 22 includes front and rear arrays of permanent magnets contained within a housing. The front portion or grill portion 34 of the housing is visible through the slotted opening 32. A dielectric diaphragm, not visible in the figures, includes electrically conductive traces thereon and is positioned between the front and rear magnet arrays. A pair of terminals 35 connects to the traces of the diaphragm and is fed from the amplifier 17 (FIG. 1) via a cross-over filter or cross-over network 36 as will be appreciated by those skilled in the art.

Typical height and width dimensions E, D for a mid-range planar diaphragm transducer 22 may be about 8 inches and 4 inches, respectively, although other sizes are also possible. Because of the increased directivity provided by the slotted waveguide 30 the cross-over filter 36 may have a relatively low order, such as a first order or a second order, thereby reducing signal distortion as will also be appreciated by those skilled in the art.

The mid-range planar diaphragm transducer 22 and/or the high-frequency range planar diaphragm transducer 23 may be operable to a desired high frequency, and the slotted opening 32 may have a width C not substantially greater than a wavelength corresponding to the desired high frequency. For example, for a desired high frequency of about 20 KHz, as is typical for stereo listening enjoyment, the slotted opening may have a width C not greater than about two-thirds of an inch. As will be appreciated by those skilled in the art, the wavelength ($\lambda$) is calculated based upon the desired high frequency (f) and the speed of sound (c) in the desired environment, such as in air at room temperature (about 345 m/s), in accordance with the well known formula $\lambda=c/f$. The depth of the slotted opening 32 is not particularly critical, and can be 1 inch or less, although other sizes are also possible.

Figure 4:
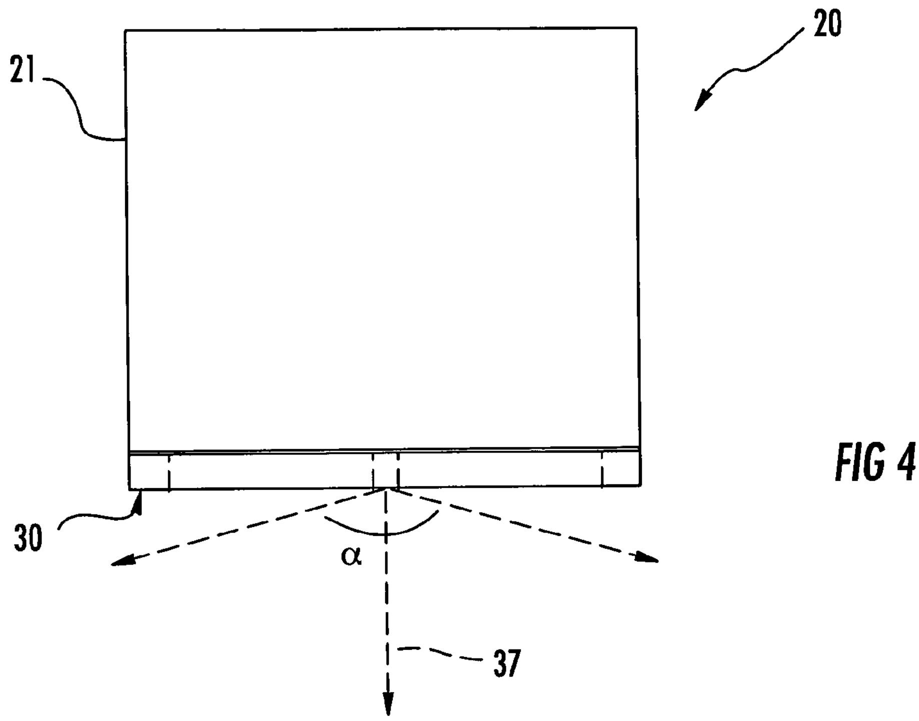
FIG. 4 is a top plan view of a loudspeaker as shown in FIG. 1.

Accordingly, and as understood with particular reference to FIG. 4, the loudspeaker 20 including the slotted waveguide 30 may provide a nearly constant directivity in the horizontal plane defined by less than a ±6 dB variation over an angle α of at least ±75 degrees from an axis 37 of the planar transducers and over a frequency range of up to about 20 KHz. In other words, the slotted waveguide 30 may serve to narrow the sound source to a dimension slightly wider than, as wide as, or less wide than the wavelength of the highest frequency to be reproduced by the loudspeaker 20. This results in constant directivity with frequency to the highest desired frequency, or from low bass to super treble frequencies, such as from 20 Hz to 20 KHz. The loudspeaker 20 provides a coherent whole which functions as a single cohesive sound source with constant directivity with frequency and wider, more even horizontal dispersion than typical or conventional planar diaphragm, conical diaphragm, or horn-loaded speakers, for example.

Figure 2:
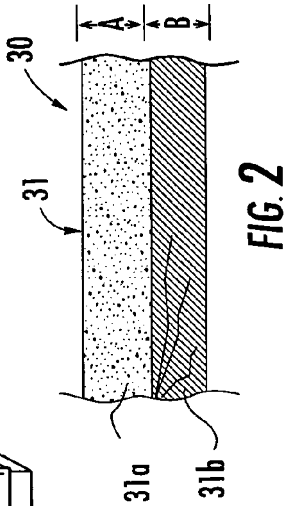
FIG. 2 is an enlarged cross-sectional view taken along lines 2-2 of FIG. 1.

As schematically illustrated in FIG. 2, the slotted waveguide 30 may include the body 31 that, in turn, illustratively includes a sound absorbing layer 31*a* having a thickness A adjacent the surface of the planar diaphragm transducer, and a sound reflecting layer 31*b* adjacent the sound absorbing layer and having a thickness B. For example, the sound absorbing layer 31*a* may comprise a sound absorbing foam, and the reflecting layer 31*b* may comprise fiberboard. The thickness A of the foam layer 31*a* may be slightly greater than the thickness B of the fiberboard layer 31*b*, with the total thickness about 1 inch. The body 31 desirably is formed of at least one material that provides self-damping at the desired operating frequencies. Of course, other materials and configurations are contemplated by the present invention. The purpose is to permit sound to propagate from only the slotted opening 32 to thereby enhance directivity. It is also desired that reflected sound energy is not directed back into the planar diaphragm transducer 22.

In the illustrated embodiment, the planar diaphragm transducer 22 is a magnetic planar diaphragm transducer, although in other embodiments the planar diaphragm transducer may be an electrostatic planar diaphragm transducer as will be appreciated by those skilled in the art. A typical electrostatic planar diaphragm transducer may not have the same sensitivity as a magnetic transducer. In other words, the magnetic planar diaphragm transducer has sufficient sensitivity to still be effective even though a portion of its sound energy is blocked. Indeed, because the diaphragm of a typical magnetic planar diaphragm transducer is clamped at its periphery, most of the sound energy is produced by the medial portion anyway.

Figure 5:
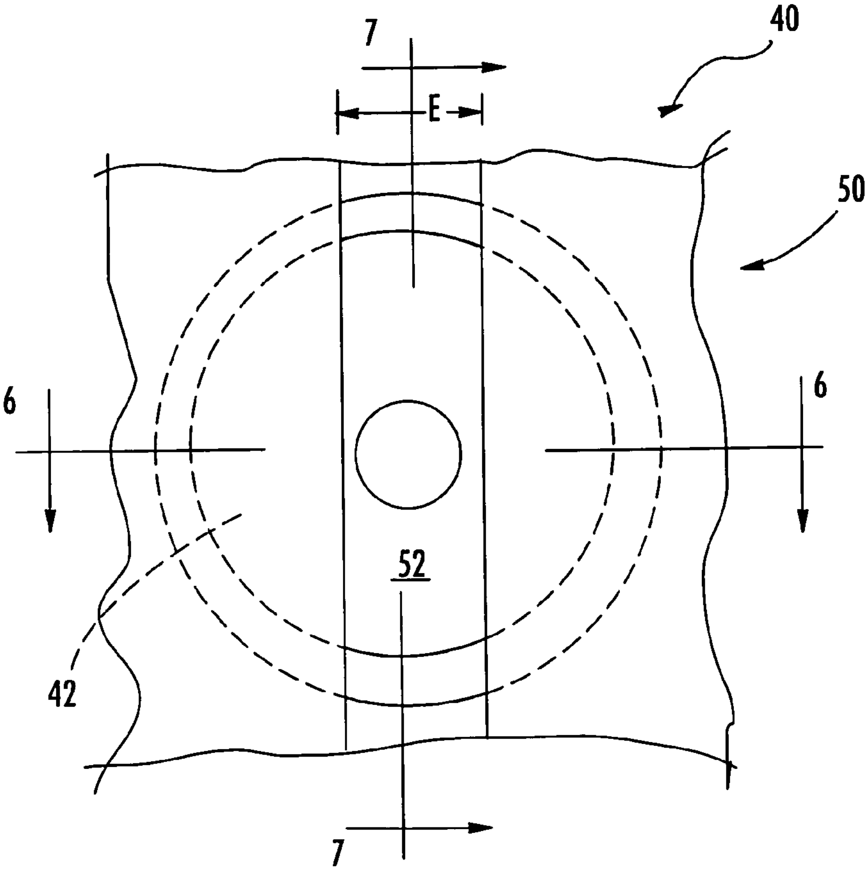
FIG. 5 is an enlarged front view of an alternative embodiment of a loudspeaker in accordance with the invention.
Figure 6:
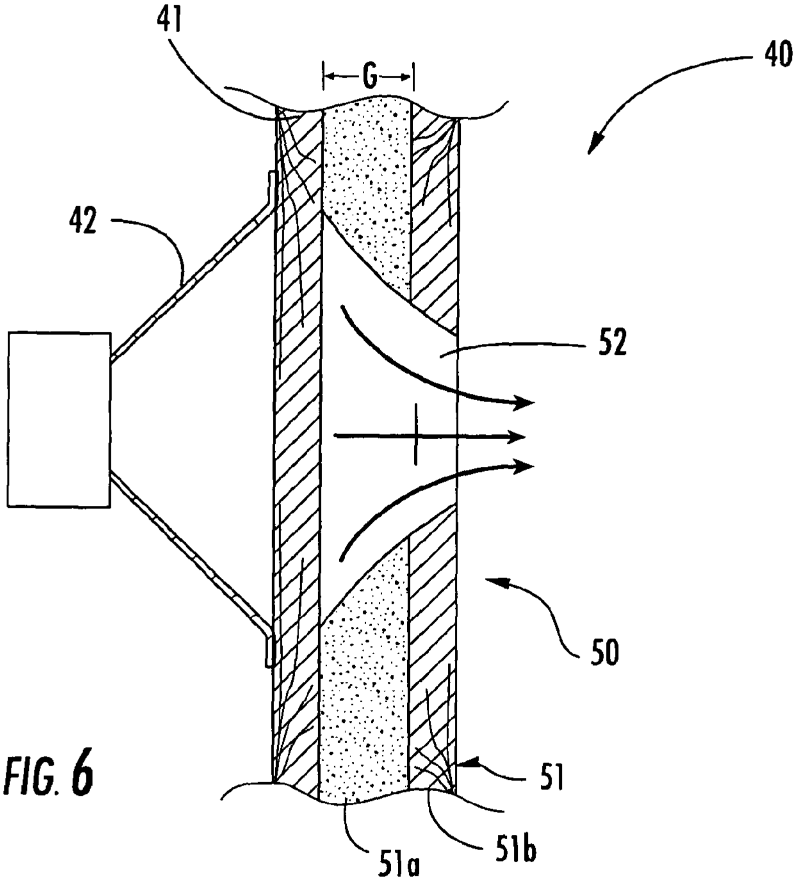
FIG. 6 is a cross-sectional view taken along lines 6-6 of FIG. 5.
Figure 7:
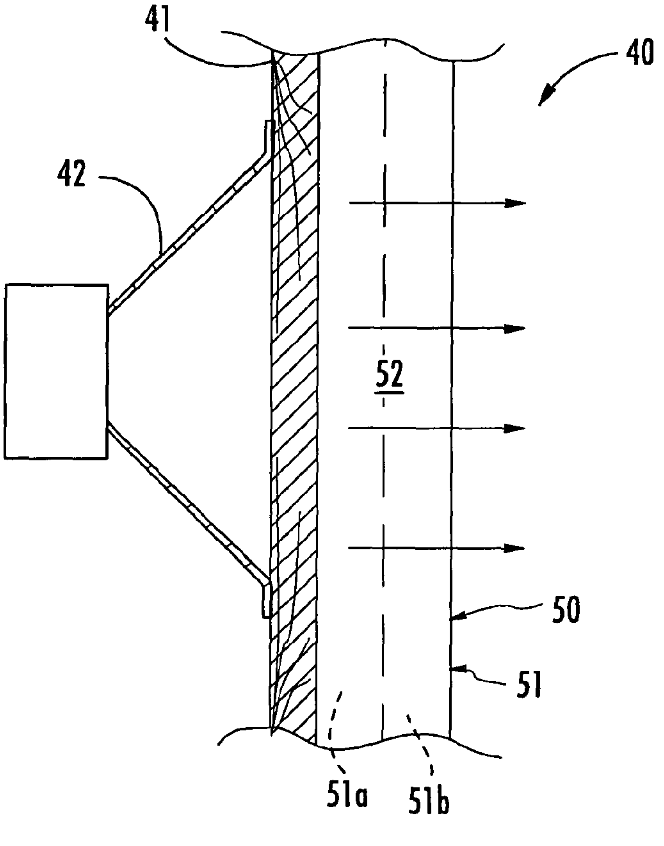
FIG. 7 is a cross-sectional view taken along lines 7-7 of FIG. 5.

Referring now additionally to FIGS. 5-7 another embodiment of a loudspeaker 40 is now described. In this embodiment, the slotted waveguide 50 is used in conjunction with a magnetic conical diaphragm transducer 42, such as a tweeter, for example. The slotted waveguide 50 includes a body 51 including a slotted opening 52 therein. The body 51 illustratively includes two material layers 51*a*, 51*b* as discussed above, although a single layer or more than two layers could be used as will be appreciated by those skilled in the art. The slotted opening width E may be sized as described above based upon the desired high operating frequency. In this embodiment, the slotted opening 42 is flared cavity to capture the sound energy from the larger diameter of the conical diaphragm transducer 42 as best seen with reference to FIG. 6.

Returning again to FIGS. 1-4, a method aspect of the invention is directed to increasing the directivity of a loudspeaker 20 comprising a baffle 21, and at least one planar diaphragm transducer 22, 23 carried by the baffle and having a front surface for radiating acoustic energy therefrom. The method may include positioning a slotted waveguide 30 adjacent the front surface of the at least one planar diaphragm transducer 22, 23. As understood with additional reference to FIGS. 5-7, another method aspect is directed to increasing the directivity of a loudspeaker 40 including a baffle 21, and at least one conical diaphragm transducer 42 carried by the baffle and having a front surface for radiating acoustic energy therefrom. The method may include positioning a slotted waveguide adjacent 50 the front surface of the at least one conical diaphragm transducer 42.

Revisiting now some of the advantages provided by the loudspeakers 20, 40 including the slotted waveguides 30, 50 as described above, one advantage is that constant directivity is achieved over full frequency range (such as 20 Hz to 20 kHz,) without horn loading, dispersion lenses, or omni-directional radiation patterns from the loudspeaker. Horn loading, which in certain configurations can provide constant directivity over a relatively narrow range of frequencies requiring several horns of diminishing sizes, imposes an undesirable coloration on sound reproduction known as the "megaphone effect", as caused by sound waves reflecting off of the inside of the horn throat.

Dispersion lenses of various sizes and configurations typically impose long diffraction paths for midrange and treble wavelengths that become secondary sound sources departing from the edges of the lens at a time delayed by significant amounts, and this may smear the arrival of precedent sounds at the listener. Omni-directional patterns, typically covering a 180 to 360 degree arc, may provide wide dispersion, but may not provide constant directivity due to lobing and other interference effects. Omni-directional patterns are also likely to produce late arrivals at the listener due to large amounts of reflected sound energy from the boundaries (walls, floor, ceiling) as found in a typical non-anechoic listening environment.

A further advantage is enabling the use of low order crossover filters which provide superior transient response, but which would otherwise suffer from irregular amplitude response on and off axis from the speaker due to wave interference (i.e., lobing). Accordingly, as noted briefly above, the loudspeaker including the slotted waveguide may use a first order or a second order parallel or series crossover filter that does not exhibit the irregular dispersion and off-axis roughness and high frequency roll-off typical of such filters.

The slotted waveguide improves amplitude linearity on axis and off axis at angles up to and including as much as 90 degrees from the axis in the horizontal plane. This results in a wider horizontal angle of coverage for a larger number of listeners on a given horizontal plane, reducing the number and expense of alternative speakers, such as horns, which do not cover listeners outside the listening positions from which the horn throat is visible.

A still further advantage is that the slotted waveguide may be used or readily added to existing planar or conical diaphragm speakers to widen their angle of horizontal coverage at low cost. As noted above, in some embodiments, the slotted waveguide may combine reflective and absorptive materials to reduce or divert sound energy from the transducers that would otherwise reflect back into the transducer's diaphragm and cause distortion of the waveform. Typically the slotted waveguide can be made from fiberboard or similar material, including sound absorbing materials such as foam, at low cost, a far less expensive alternative to horn loading or similar alternative approaches to achieve wider angles.

The function of the slotted waveguide can be duplicated by making all mid and treble transducers of the same width as the slot in the waveguide. The disadvantage of this approach may be greatly reduced sensitivity in the mid and treble transducers due to their small size and radiating area. Electrostatically and magnetically driven planar drivers are generally considerably wider than this in size to achieve adequate sensitivity and output levels, but at the cost of good directivity with frequency and broad horizontal dispersion. Accordingly, many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that other modifications and embodiments are intended to be included within the scope of the appended claims.

That which is claimed is:

1. A loudspeaker comprising:

a baffle;

at least one planar diaphragm transducer carried by said baffle and having a front surface for radiating acoustic energy therefrom; and a slotted waveguide adjacent the front surface of said at least one planar diaphragm transducer and sealing completely around opposing portions of said baffle;

said slotted waveguide comprising a body having a slotted opening therein, and said at least one planar diaphragm transducer having an elongated rectangular shape aligned with the slotted opening;

said slotted waveguide providing a horizontal directivity defined by less than a +/−6 dB variation over at least +/−75 degrees from an axis of said at least one planar diaphragm transducer and over a frequency range of up to about 20 KHz.

2. A loudspeaker according to claim 1 wherein said at least one planar diaphragm transducer has a width greater than a width of the slotted opening.

3. A loudspeaker according to claim 1 wherein said at least one planar diaphragm transducer is operable to a desired high frequency; and wherein the slotted opening has a width not substantially greater than a wavelength corresponding to the desired high frequency.

4. A loudspeaker according to claim 3 wherein the desired high frequency is about 20 KHz; and wherein the slotted opening has a width not greater than about two-thirds of an inch.

5. A loudspeaker according to claim 1 wherein said slotted waveguide comprises:

a sound absorbing layer adjacent the surface of said at least one planar diaphragm transducer; and a sound reflecting layer adjacent said sound absorbing layer.

6. A loudspeaker according to claim 1 wherein said slotted waveguide has outer peripheral portions aligned with corresponding outer peripheral portions of said baffle.

7. A loudspeaker according to claim 1 wherein said at least one planar diaphragm transducer comprises at least one magnetic planar diaphragm transducer.

8. A loudspeaker according to claim 1 further comprising at least one of a first order and a second order cross-over filter carried by said baffle and connected to said at least one planar diaphragm transducer.

9. A loudspeaker according to claim 1 further comprising at least one conical diaphragm transducer carried by said baffle.

10. A loudspeaker comprising:

a baffle;

at least one planar diaphragm transducer carried by said baffle and having a front surface for radiating acoustic energy therefrom and being operable to a desired high frequency; and a slotted waveguide adjacent the front surface of said at least one planar diaphragm transducer and sealing completely around opposing portions of said baffle, said slotted waveguide comprising a body having a slotted opening therein with a width not substantially greater than a wavelength corresponding to the desired high frequency;

said at least one planar diaphragm transducer having an elongated rectangular shape aligned with the slotted opening;

said slotted waveguide providing a horizontal directivity defined by less than a +/−6 dB variation over at least +/−75 degrees from an axis of said at least one planar diaphragm transducer and over a frequency range of up to about 20 KHz.

11. A loudspeaker according to claim 10 wherein said at least one planar diaphragm transducer has a width greater than a width of the slotted opening.

12. A loudspeaker according to claim 10 wherein the desired high frequency is about 20 KHz; and wherein the slotted opening has a width not greater than about two-thirds of an inch.

13. A loudspeaker according to claim 10 wherein said at least one planar diaphragm transducer comprises at least one magnetic planar diaphragm transducer.

14. A loudspeaker according to claim 10 further comprising at least one conical diaphragm transducer carried by said baffle.

15. A method for increasing directivity of a loudspeaker comprising a baffle, and at least one planar diaphragm transducer carried by the baffle and having a front surface for radiating acoustic energy therefrom, the method comprising:

positioning a slotted waveguide adjacent the front surface of the at least one planar diaphragm transducer and sealing completely around opposing portions of the baffle;

the slotted waveguide comprising a body having a slotted opening therein and the at least one planar diaphragm transducer having an elongated rectangular shape aligned with the slotted opening; and the slotted waveguide providing a horizontal directivity defined by less than a +/−6 dB variation over at least +/−75 degrees from an axis of the at least one planar diaphragm transducer and over a frequency range of up to about 20 KHz.

16. A method according to claim 15 wherein the at least one planar diaphragm transducer has a width greater than a width of the slotted opening.

17. A method according to claim 15 wherein the at least one planar diaphragm transducer is operable to a desired high frequency; and wherein the slotted opening has a width not substantially greater than a wavelength corresponding to the desired high frequency.

18. A method according to claim 17 wherein the desired high frequency is about 20 KHz; and wherein the slotted opening has a width not greater than about two-thirds of an inch.

19. A method according to claim 15 wherein the slotted waveguide comprises:

a sound absorbing layer adjacent the surface of the at least one planar diaphragm transducer; and a sound reflecting layer adjacent the sound absorbing layer.

20. A method according to claim 15 wherein the at least one planar diaphragm transducer comprises at least one magnetic planar diaphragm transducer.

21. A loudspeaker comprising:

a baffle;

at least one conical diaphragm transducer carried by said baffle and having a front surface for radiating acoustic energy therefrom; and a slotted waveguide adjacent the front surface of said at least one conical diaphragm transducer and sealing completely around opposing portions of said baffle;

said slotted waveguide comprising a body having a slotted opening therein and the at least one conical diaphragm transducer having a shape aligned with the slotted opening; and the slotted waveguide providing a horizontal directivity defined by less than a +/−6 dB variation over at least +/−75 degrees from an axis of the at least one conical diaphragm transducer and over a frequency range of up to about 20 KHz.

22. A loudspeaker according to claim 21 wherein said at least one conical diaphragm transducer has a width greater than a width of the slotted opening.

23. A loudspeaker according to claim 21 wherein said at least one conical diaphragm transducer is operable to a desired high frequency; and wherein the slotted opening has a width not substantially greater than a wavelength corresponding to the desired high frequency.

24. A loudspeaker according to claim 23 wherein the desired high frequency is about 20 KHz; and wherein the slotted opening has a width not greater than about two-thirds of an inch.

25. A loudspeaker according to claim 21 wherein said slotted waveguide comprises:

a sound absorbing layer adjacent the surface of said at least one conical diaphragm transducer; and a sound reflecting layer adjacent said sound absorbing layer.

26. A method for increasing directivity of a loudspeaker comprising a baffle, and at least one conical diaphragm transducer carried by the baffle and having a front surface for radiating acoustic energy therefrom, the method comprising:

positioning a slotted waveguide adjacent the front surface of the at least one conical diaphragm transducer and sealing completely around opposing portions of the baffle;

the slotted waveguide comprising a body having a slotted opening therein and the at least one conical diaphragm transducer having a shape aligned with the slotted opening; and the slotted waveguide providing a horizontal directivity defined by less than a +/−6 dB variation over at least +/−75 degrees from an axis of the at least one conical diaphragm transducer and over a frequency range of up to about 20 KHz.

27. A method according to claim 26 wherein the at least one conical diaphragm transducer has a width greater than a width of the slotted opening.

28. A method according to claim 26 wherein the at least one conical diaphragm transducer is operable to a desired high frequency; and wherein the slotted opening has a width not substantially greater than a wavelength corresponding to the desired high frequency.

29. A method according to claim 28 wherein the desired high frequency is about 20 KHz; and wherein the slotted opening has a width not greater than about two-thirds of an inch.

30. A method according to claim 26 wherein the slotted waveguide comprises:

a sound absorbing layer adjacent the surface of the at least one conical diaphragm transducer; and a sound reflecting layer adjacent the sound absorbing layer.

* * * * *